(12) United States Patent
Richter et al.

(10) Patent No.: US 11,257,705 B2
(45) Date of Patent: Feb. 22, 2022

(54) METHOD OF SELECTING SEMICONDUCTOR CHIPS

(71) Applicant: OSRAM Opto Semiconductors GmbH, Regensburg (DE)

(72) Inventors: Daniel Richter, Bad Abbach (DE); Gunnar Petersen, Regensburg (DE); Konrad Wagner, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 10 days.

(21) Appl. No.: 16/468,324

(22) PCT Filed: Jan. 24, 2018

(86) PCT No.: PCT/EP2018/051747
§ 371 (c)(1),
(2) Date: Jun. 11, 2019

(87) PCT Pub. No.: WO2018/138162
PCT Pub. Date: Aug. 2, 2018

(65) Prior Publication Data
US 2020/0090975 A1   Mar. 19, 2020

(30) Foreign Application Priority Data
Jan. 26, 2017   (DE) .................. 10 2017 101 536.1

(51) Int. Cl.
*H01L 21/683* (2006.01)
*H01L 21/78* (2006.01)
(Continued)

(52) U.S. Cl.
CPC .......... *H01L 21/6836* (2013.01); *H01L 21/52* (2013.01); *H01L 21/78* (2013.01);
(Continued)

(58) Field of Classification Search
CPC ................. H01L 21/6836; H01L 21/78; H01L 2221/68354; H01L 2221/68322;
(Continued)

(56) References Cited

U.S. PATENT DOCUMENTS 6,830,946 B2 *  12/2004  Yanagisawa ............ H01L 24/24
                                                                  438/26
6,972,204 B2 *  12/2005  Oohata .................... H01L 24/82
                                                                  438/22
(Continued)

FOREIGN PATENT DOCUMENTS

DE          198 40 226        3/2000
DE       10 2017 101 538      7/2018
WO         2009/003435        1/2009

*Primary Examiner* — Savitri Mulpuri
(74) *Attorney, Agent, or Firm* — DLA Piper LLP (US)

(57) ABSTRACT

A method of selecting semiconductor chips includes: A) providing the semiconductor chips in a composite, B) producing a cohesive, mechanical first connection between the semiconductor chips and a carrier film, C) singulating the semiconductor chips, wherein the carrier film mechanically connects the semiconductor chips to one another after singulation, D) selectively weakening the first connection between some singulated semiconductor chips and the carrier film, depending on electro-optical and/or electrical properties of the semiconductor chips, and E) removing the semiconductor chips whose first connection is selectively weakened from the carrier film.

14 Claims, 6 Drawing Sheets

(51) Int. Cl.
*H01L 25/00* (2006.01)
*H01L 23/00* (2006.01)
*H01L 21/52* (2006.01)

(52) U.S. Cl.
CPC .............. *H01L 24/97* (2013.01); *H01L 25/50* (2013.01); *H01L 2221/68322* (2013.01); *H01L 2221/68327* (2013.01); *H01L 2221/68368* (2013.01); *H01L 2221/68381* (2013.01)

(58) Field of Classification Search
CPC . H01L 2221/68368; H01L 2221/68381; H01L 2221/68327; H01L 25/50; H01L 24/97; H01L 21/52; H01L 21/568
See application file for complete search history.

(56) References Cited

U.S. PATENT DOCUMENTS

| | | | |
|---|---|---|---|
| 9,434,150 B2 * | 9/2016 | Bower | B25J 15/00 |
| 2002/0153832 A1 * | 10/2002 | Yanagisawa | H01L 24/82 |
| | | | 313/505 |
| 2003/0022403 A1 | 1/2003 | Shimoda et al. | |
| 2003/0160258 A1 * | 8/2003 | Oohata | H01S 5/04256 |
| | | | 257/99 |
| 2003/0162463 A1 | 8/2003 | Hayashi et al. | |
| 2005/0087743 A1 | 4/2005 | Ogihara et al. | |
| 2016/0155892 A1 | 6/2016 | Li et al. | |
| 2016/0219702 A1 | 7/2016 | Chaji et al. | |
| 2016/0276205 A1 | 9/2016 | Huska et al. | |

* cited by examiner

METHOD OF SELECTING SEMICONDUCTOR CHIPS

TECHNICAL FIELD

This disclosure relates to a method of selecting semiconductor chips.

BACKGROUND

Among other things, there is a need to provide a method with which semiconductor chips can be selected particularly efficiently.

SUMMARY

We provide a method of selecting semiconductor chips including: A) providing the semiconductor chips in a composite, B) producing a cohesive, mechanical first connection between the semiconductor chips and a carrier film, C) singulating the semiconductor chips, wherein the carrier film mechanically connects the semiconductor chips to one another after singulation, D) selectively weakening the first connection between some singulated semiconductor chips and the carrier film, depending on electro-optical and/or electrical properties of the semiconductor chips, and E) removing the semiconductor chips whose first connection is selectively weakened from the carrier film.

We also provide a method of selecting semiconductor chips including: A) providing the semiconductor chips in a composite, B) producing a cohesive, mechanical first connection between the semiconductor chips and a carrier film, C) singulating the semiconductor chips, wherein the carrier film mechanically connects the semiconductor chips to one another after singulation, D) selectively weakening the first connection between some singulated semiconductor chips and the carrier film, and E) removing the semiconductor chips whose first connection is selectively weakened from the carrier film.

REFERENCE NUMERALS 10 composite
100 semiconductor chip
200 plate
201 opening
500 carrier film
501 connection means
502 weakened region
550 adhesive film
551 further connection means
L electromagnetic radiation
R direction
T separation line

DETAILED DESCRIPTION

Our semiconductor chips are, for example, optoelectronic semiconductor chips configured to receive and/or emit electromagnetic radiation. The semiconductor chips may be, for example, light-emitting diode chips, laser diode chips or photodiode chips.

In the method of selecting semiconductor chips, a method step A) may provide the semiconductor chips in a composite. The semiconductor chips may mechanically connect to each other. For example, the semiconductor chips have been produced in a common manufacturing process. In particular, the semiconductor chips comprise a semiconductor layer sequence produced on a common substrate by an epitaxy process. For example, the composite comprises the substrate on which the semiconductor chips have been produced. Alternatively, the semiconductor chips are applied to a carrier and detached from the substrate on which the semiconductor chips are produced. The semiconductor chips are arranged side by side in the composite in a lateral plane. For example, the semiconductor chips are arranged along the lines of a regular lattice, for example, a rectangular lattice, in particular a hexagonal lattice.

In the method of selecting semiconductor chips, a first connection between the semiconductor chips and a carrier film may be produced in a method step B). The first connection is in particular a cohesive and mechanical connection. A mechanical connection is a connection by which two connection partners are mechanically coupled to one another so that the relative mobility of two parts relative to one another in at least one spatial direction is restricted. In particular, the relative mobility between the semiconductor chips and the carrier film is restricted in all spatial directions relative to one another so that the carrier film and the semiconductor chips cannot be moved relative to one another in any spatial direction. A cohesive connection is a connection in which two connection partners are held together by atomic or molecular forces. For example, the cohesive connection is an adhesive connection.

The carrier film is placed on a major surface of the composite. For example, the composite is completely covered by the carrier film. The first connection between the semiconductor chips and the carrier film can be produced by a connection means. For example, the connection means is an adhesive, in particular a UV-sensitive adhesive. The first connection mediated by the UV-sensitive adhesive can be weakened or strengthened by irradiation of the adhesive with UV radiation.

The semiconductor chips may be singulated in a method step C), wherein the carrier film mechanically connects the semiconductor chips to one another after singulation. For example, the semiconductor chips are singulated by a sawing process and/or by an etching process from a side facing away from the carrier film. In particular, the carrier film is not severed during the singulation of the semiconductor chips so that the singulated semiconductor chips mechanically couple to one another via the carrier film.

In a method step D) the cohesive first connection between some singulated semiconductor chips and the carrier film may be selectively weakened. For example, the mechanical connection between the connection means and the semiconductor chips and/or between the connection means and the carrier film is weakened. A weakened first connection has a lower mechanical stability than a non-weakened first connection. In particular, the first connection can be weakened such that there is no cohesive connection between the semiconductor chip and the carrier film. For example, the semiconductor chips, whose first connection is weakened, loosely rest on the carrier film. The force needed to release a semiconductor chip from the carrier film is less at a weakened first connection than at a non-weakened first connection. Weakening of the first connection can also take place in that the first connection is strengthened for the other semiconductor chips whose first connection should not be weakened. The first connection is weakened for the some semiconductor chips relative to the first connection for the other semiconductor chips.

In a method step E), the semiconductor chips, whose cohesive first connection is selectively weakened, may be removed from the carrier film. For example, the semiconductor chips are removed from the carrier film in a common method step, in particular simultaneously.

The method may comprise the following method steps:
A) the semiconductor chips are provided in a composite,
B) a cohesive, mechanical first connection between the semiconductor chips and a carrier film is produced,
C) the semiconductor chips are singulated, wherein the carrier film mechanically connects the semiconductor chips to one another after singulation,
D) the first connection between some singulated semiconductor chips and the carrier film is selectively weakened, and
E) the semiconductor chips whose first connection is selectively weakened are removed from the carrier film.

The method of selecting semiconductor chips is based, inter alia, on the following considerations. To select semiconductor chips, for example, LED chips located, for example, in a common composite, the semiconductor chips are successively selected and removed from the assembly, for example, by a pick-and-place method. In this procedure, the semiconductor chips are sequentially selected, which requires a lot of time for the procedure.

The method of selecting semiconductor chips now makes use, inter alia, of the idea of carrying out the selection of the semiconductor chips in parallel. For example, the semiconductor chips cohesively connect to a carrier film by a connection means. The cohesive first connection between the semiconductor chips to be selected and the carrier film is selectively weakened by UV radiation, for example. In a further method step, the semiconductor chips to be selected are removed from the composite of the semiconductor chips in a common method step. Advantageously, the cost and time required can be reduced by parallel selection of the semiconductor chips.

In method step D), the first connection between the carrier film and the some semiconductor chips may be selectively weakened by UV radiation. In particular, considering a relative weakening of the first compounds, first compounds not irradiated with UV radiation are weakened compared to first compounds after they have been irradiated with UV radiation. For example, the semiconductor chips are cohesively connected to the carrier film by a UV-sensitive connection means. For example, the connection means is an adhesive changed under UV irradiation so that the adhesive loses its holding force or the holding force is at least reduced. For example, the carrier film is the UV-sensitive adhesive tape Adwill D 175 from the manufacturer Lintec.

Advantageously, by targeted exposure of the carrier film, the first connection to the chips to be selected can be reduced. In particular, regions in which the semiconductor chips to be selected are cohesively connected to the carrier film are only partially exposed to UV radiation so that the first connection between the semiconductor chips to be selected and the carrier film is weakened only in a subregion. Advantageously, weakening of the first cohesive connection between the semiconductor chips and the carrier film by UV radiation makes it possible to weaken the first connection particularly precisely in predetermined regions.

The first connection between the carrier film and a plurality of semiconductor chips may be selectively weakened in a single method step. For example, the first compound is weakened by exposure to UV radiation. In particular, a UV laser is used for exposure. When using a UV laser to expose the connections, the first connections can be sequentially attenuated in a common process step. Alternatively, a digital mirror chip (DMD chip) with a UV light source is used. By the digital mirror chip, the electromagnetic radiation of the UV light source is selectively directed to regions in which the carrier film cohesively connects to the semiconductor chips to be selected. When using a digital mirror chip with a UV light source, the first connections can be weakened simultaneously in a common process step. Advantageously, the cohesive connection can thus be weakened in a particularly time-saving manner with high resolution in the lateral plane.

In method step D) the first connection between the carrier film and the semiconductor chips may be weakened depending on the electro-optical and/or electrical properties of the semiconductor chips. For example, the semiconductor chips whose cohesive connection to the carrier film is weakened in a single method step have, within a tolerance range, a common color location. In particular, the semiconductor chips, whose connection to the carrier film is weakened in a single method step, have an equal current-voltage characteristic within a tolerance range. Advantageously, semiconductor chips which have the same color location within a predefinable and selectable tolerance range or which can be electrically driven in the same way since they have the same electro-optical and/or electrical properties, are thus selected.

In method step D), the connection between the carrier film and the semiconductor chips may be weakened depending on the spatial arrangement of the semiconductor chips in the composite. For example, the cohesive connection between the semiconductor chips and the carrier film is locally weakened independently of the electro-optical and or electrical properties of the individual semiconductor chips. For example, the mechanical connection between the carrier film and the semiconductor chips is weakened in the form of a checkerboard pattern. In this example, the mechanical connection between the semiconductor chips and the carrier film is weakened alternately so that the mechanical connection between each second semiconductor chip and the carrier film is weakened. In particular, each semiconductor chip whose connection to the carrier film has been weakened is arranged adjacent to semiconductor chips whose mechanical connection to the carrier film has not been weakened. In particular, by weakening the first connection, depending on the spatial arrangement of the semiconductor chips in the composite, a targeted arrangement of the semiconductor chips removed in process step E) from the carrier film and or the semiconductor chips that remain on the carrier film, is achieved. Advantageously, a targeted spatial arrangement of the semiconductor chips facilitates their further processing, since in this way the distances between the semiconductor chips can be increased in a simple manner.

The semiconductor chips may be removed in method steps E) depending on their spatial arrangement so that the distance between adjacent semiconductor chips which remain on the carrier film and/or adjacent semiconductor chips removed from the carrier film is at least 50 µm, in particular at least 100 µm. For example, in the plan view of a main surface, the semiconductor chips have a rectangular contour of edges, wherein the edges delimit the main surface of the semiconductor chips in the lateral direction. The edges have a maximum length of 200 µm, in particular of 100 µm.

For example, the mechanical connection between the semiconductor chips and the carrier film is weakened in the form of a checkerboard pattern. After selective removal of the semiconductor chips whose mechanical connection to the carrier film has been weakened, the distance between the semiconductor chips which remain on the carrier film is thus at least 200 µm, in particular at least 100 µm. Advantageously, the distance between the semiconductor chips remain on the carrier film is selected so that the semiconductor chips can be processed particularly easily. For example, a leadframe can be arranged on the semiconductor chips remaining on the carrier film without the leadframe covering a further adjacent semiconductor chip arranged on the carrier film.

A map may be created before selective weakening of the first connection between the semiconductor chips and the carrier film, wherein the map comprises the electro-optical and or electrical properties of the semiconductor chips and their position in the compound as data and the connection between the semiconductor chips and the carrier film is weakened depending on the data of the map. For example, before the first connection between the semiconductor chips and the carrier film is weakened, a method step takes place in which the electrical and or electro-optical properties of the semiconductor chips are measured. In this method step, the properties obtained in the measurement and the position of the semiconductor chip in the composite are assigned to one another. For example, the semiconductor chips are electrically contacted and supplied with current to characterize their electro-optical and/or electrical properties. For example, a property of the electromagnetic radiation emitted by the semiconductor chips is measured. Advantageously, the use of a map comprising the electro-optical and/or electrical properties of the semiconductor chips and their position in the composite as data enables the selection of the semiconductor chips from the composite depending on a property that has been previously determined.

Method steps D) and E) may be performed alternately several times in succession. For example, if the method step in which the mechanical connection between the semiconductor chips and the carrier film is weakened is performed several times, the connection between the semiconductor chips and the carrier film is weakened depending on different selection criteria. In particular, the semiconductor chips are selected in a first execution of the method steps D) and E) depending on a first property and then in a second execution of the method steps D) and E) the semiconductor chips are selected depending on a second property. Advantageously, a plurality of selection criteria can be combined with each other on the basis of which the semiconductor chips are selected.

In method step E), the semiconductor chips may be removed from the carrier film by suction. For example, the semiconductor chips are sucked to a plate having a plurality of openings through which air is sucked. This plate is arranged on the side of the semiconductor chips facing away from the carrier film so that the semiconductor chips adhere to the plate due to the negative pressure in the openings of the plate and can be lifted with this from the carrier film. For example, the plate is a vacuum chuck.

The use of such a plate enables a time-saving and reliable lifting of the semiconductor chips whose mechanical connection to the carrier film is weakened. In particular, all semiconductor chips whose mechanical connections to the carrier film have been weakened are simultaneously removed from the carrier film by suction. In particular, the negative pressure by which the semiconductor chips are sucked onto the plate can be adjusted. Thus, the force with which the semiconductor chips are removed from the carrier film is adjustable. For example, the force between the semiconductor chips and the plate may be set smaller than the holding force of the first connection. Advantageously, therefore, only semiconductor chips are particularly reliably removed from the carrier film whose first connection to the carrier film has previously been weakened.

The following method steps may be carried out within method step E) to remove the semiconductor chips from the carrier film:

arranging an adhesive film on the side facing away from the carrier film of the semiconductor chips so that the adhesive film produces a cohesive, mechanical second connection with the semiconductor chips, wherein the first connection between the semiconductor chips and the carrier film is stronger than the second connection between the semiconductor chips and the adhesive film, if the first connection has not been weakened, and the first connection between the semiconductor chips and the carrier film is weaker than the second cohesive connection between the semiconductor chips and the adhesive film, when the first connection has been weakened, removing the adhesive film, wherein semiconductor chips whose first connection to the carrier film has been weakened are removed from the carrier film.

By such a procedure for the selective removal of the semiconductor chips from the carrier film, the semiconductor chips that are removed from the carrier film are again arranged on a film, namely the adhesive film. The adhesive film is formed, for example, with a polymer material. In particular, the adhesive film comprises a further connection means, by which a second connection is formed between the semiconductor chips and the adhesive film. Advantageously, the semiconductor chips, if they are arranged on a film, can be processed particularly well.

Furthermore, the method of selecting the semiconductor chips, in particular method steps D) and E), can again be applied to the semiconductor chips now arranged on the adhesive film. For example, the adhesive film comprises a further connection means by which the semiconductor chips and the adhesive film connect to one another via a second connection. In particular, the further connection means is UV-sensitive so that the second connection can be selectively weakened by exposing the further connection means. When the method is used again, the semiconductor chips can be selected depending on a different property than in the first implementation of the method. For example, semiconductor chips may first be removed from the carrier film by an adhesive film, depending on their position in the composite. Subsequently, the semiconductor chips can be removed from the adhesive film by a further adhesive film or a plate with openings, depending on their electrical and/or optoelectronic properties.

The distance between adjacent semiconductor chips may be increased by stretching the carrier film and/or the adhesive film. For example, the carrier film and/or the adhesive film are stretched in their main extension plane in at least one direction so that the distance between adjacent semiconductor chips is increased. For example, this facilitates the arrangement of a contact element, for example, an electrode or a leadframe on the individual semiconductor chips, without the contact element covering further adjacent semiconductor chips. In addition, by stretching the carrier film or the adhesive film, the first and/or the second connection can be weakened so that the semiconductor chips can be detached from the carrier film and/or the carrier film in a simplified manner. Advantageously, an increase in the distance between adjacent semiconductor chips simplifies the further processing of the semiconductor chips.

Advantages and developments of the method of selecting semiconductor chips will become apparent from the examples described below in association with the figures.

In the examples and figures, similar or similarly acting constituent parts are provided with the same reference symbols. The elements illustrated in the figures and their size relationships among one another should not be regarded as true to scale. Rather, individual elements may be represented with an exaggerated size for the sake of better representability and/or for the sake of better understanding.

Figure 1A:
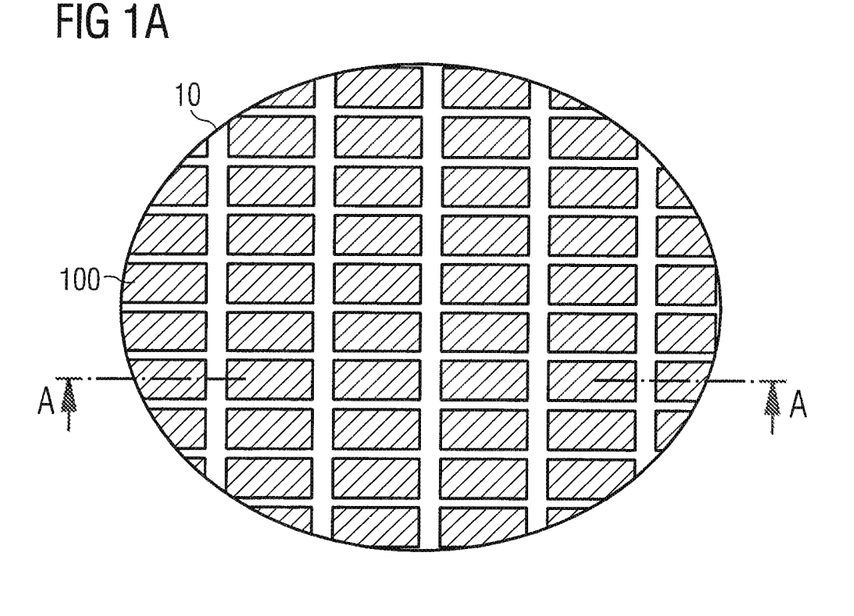
FIG. 1A shows a plan view of a composite of semiconductor chips provided in the method of selecting semiconductor chips.

FIG. 1A shows a schematic plan view of a composite 10 of semiconductor chips 100 provided in the method of selecting semiconductor chips in a method step A) according to a first example. The composite 10 comprises, for example, a substrate on which the semiconductor chips 100 are produced, for example, in an epitaxial process. Alternatively, the composite 10 of semiconductor chips 100 may include an electrically conductive carrier on which the semiconductor chips 100 are disposed with the substrate on which the semiconductor chips 100 are produced being removed. The semiconductor chips 100 are arranged at a distance from one another in a common lateral plane. For example, the semiconductor chips 100 are arranged at the grid points of a regular rectangular lattice in a plane.

Figure 1B:
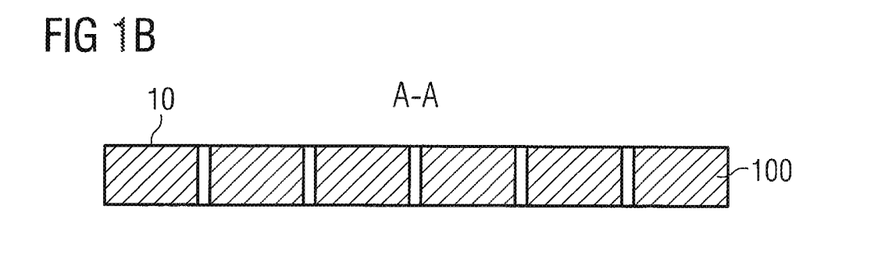
FIGS. 1B, 1C, 1D, 1E, 2A, 2B, 3A and 3B show method steps of examples of a method of selecting semiconductor chips on the basis of a schematic sectional view of the processed semiconductor chips.

FIG. 1B shows a schematic sectional view of the composite 10 of semiconductor chips 100 from FIG. 1A according to a first example. The dashed line AA in FIG. 1A marks a sectional plane along which the following sectional views are shown. The semiconductor chips mechanically firmly connect to each other. For example, the semiconductor chips comprise a common semiconductor layer stack via which the semiconductor chips mechanically connect to one another. In particular, the semiconductor layer stack is set up to receive or emit electromagnetic radiation.

Figure 1C:
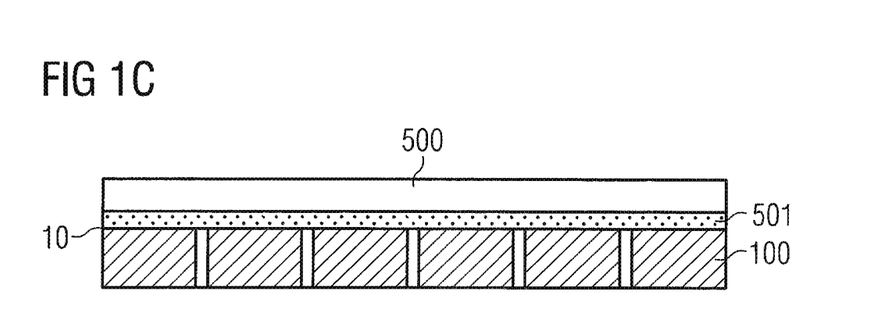

FIG. 1C shows, in a schematic sectional view, the composite 10 of semiconductor chips 100 from FIG. 1B when carrying out a method step B) of the method of selecting semiconductor chips 100 according to a first example. In this method step, a carrier film 500 is arranged on a main surface of the semiconductor chips 100 located in the composite 10. By a connection means 501, a first connection is produced that connects the composite 10 of semiconductor chips 100 in a cohesively, mechanically strong manner to the carrier film 500. The carrier film is, for example, a polymer film at least partially transparent to electromagnetic radiation, in particular UV radiation. The connection means 501 is in direct contact with the composite 10 and the carrier film 500.

Figure 1D:
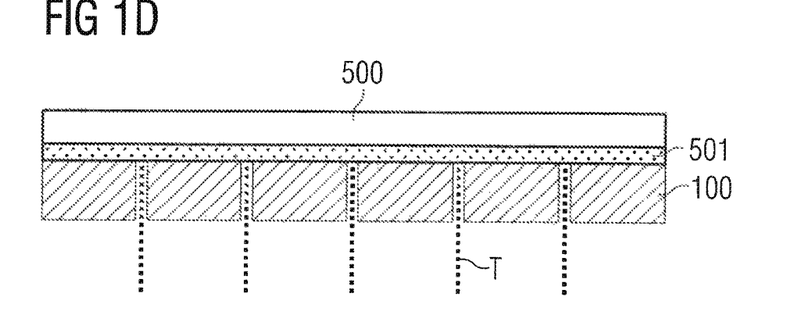

FIG. 1D shows a schematic sectional view of the semiconductor chips 100 from FIG. 1C after performing a method step C) of the method of selecting semiconductor chips 100 according to a first example. In the method step, the semiconductor chips 100 were singulated. In the singulation, the composite 10 of the semiconductor chips 100 was severed along the dividing line T. In particular, the composite 10 is completely severed along the dividing lines T. For example, the semiconductor chips 100 are singulated by a sawing process and/or an etching process. The singulated semiconductor chips 100 are mechanically coupled to one another via the carrier film 500. In particular, the semiconductor chips 100 mechanically connect to one another exclusively via the carrier film 500.

Figure 1E:
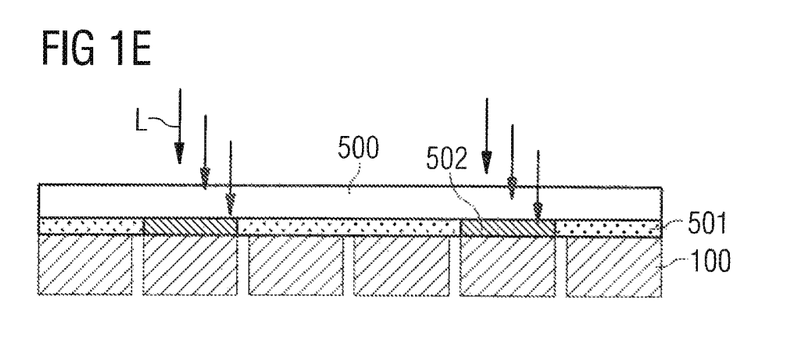

FIG. 1E shows, in a schematic sectional view, the semiconductor chips 100 from FIG. 1D when carrying out a method step D) of the method of selecting semiconductor chips 100 according to a first example. In the method step, the layer of the connection means 501 is irradiated with electromagnetic radiation L from the side of the carrier film 500 facing away from the semiconductor chips 100. In particular, only selected regions of the connection means 501 are irradiated from the side facing away from the semiconductor chips. For example, to irradiate the connection means 501 laser radiation is directed to the regions to be irradiated. Alternatively, a mirror array (also called "Digital Mirror Device") is used to direct the electromagnetic radiation L targeted to regions of the connection means 501. In particular, the electromagnetic radiation L comprises UV radiation.

In exposed regions 502 in which the connection means 501 was exposed to electromagnetic radiation L, the first connection between the semiconductor chips 100 and the carrier film 500 is weakened. In the exposed regions 502, the first connection is weaker than in regions of the connection means 501 in which the connection means 501 has not been exposed. In particular, the first connection between the carrier film 500 and the semiconductor chips 100 may be weakened such that the first connection is completely detached in the exposed regions 502.

Figure 2A:
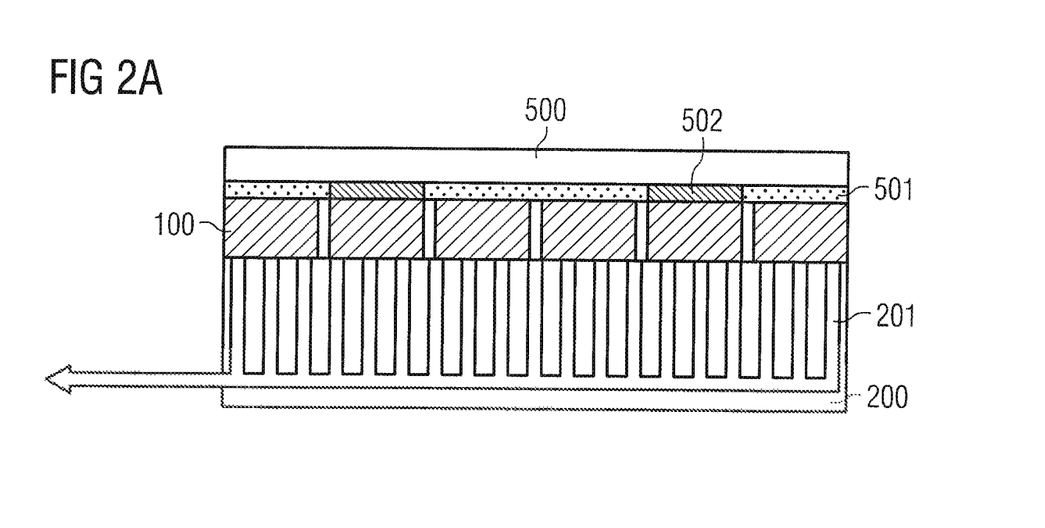

FIG. 2A shows, in a schematic sectional representation, the semiconductor chips 100 from FIG. 1E when performing a method step E) of the method of selecting semiconductor chips 100 according to a first example. On the side facing away from the carrier film 500 side of the semiconductor chip 100 a plate 200 (also called "chuck") is arranged. The plate 200 comprises a plurality of openings 201 arranged on the surface of the plate 200 facing the semiconductor chips 100. In the openings 201, a negative pressure is generated, for example, by a vacuum pump connected to the openings. Thus, the semiconductor chips 100 are sucked to the plate. In this example, by adjusting the negative pressure in the openings 201, the force with which the semiconductor chips 100 are sucked onto the plate 200 can be selected specifically.

Figure 2B:
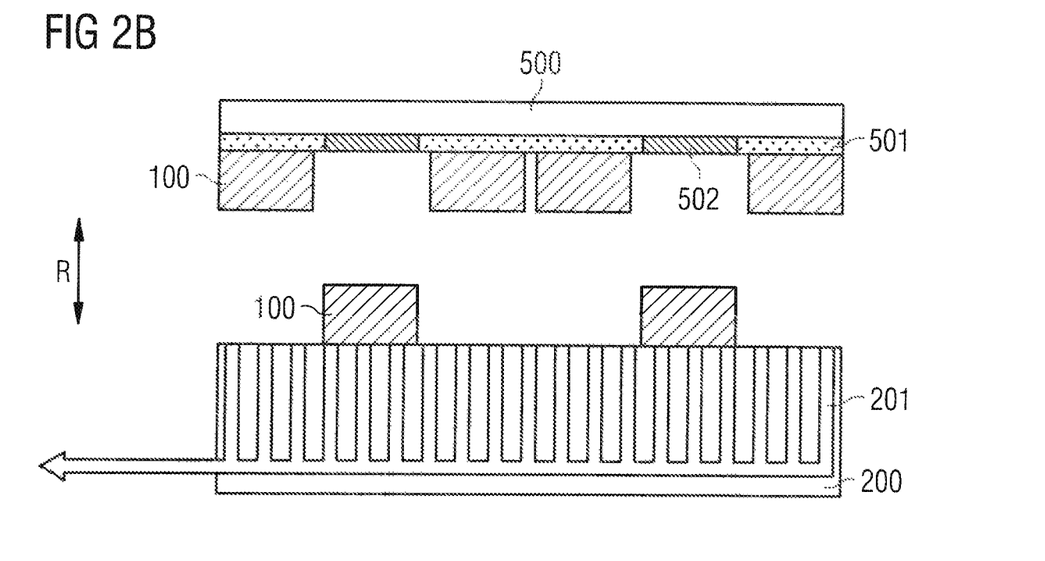

FIG. 2B shows, in a schematic sectional illustration, the semiconductor chips 100 from FIG. 2A when carrying out a method step E) of the method of selecting semiconductor chips 100 according to a first example. The carrier film 500 and the plate 200 are pulled apart along a direction R perpendicular to the lateral plane. The force with which the semiconductor chips 100 are sucked to the plate 200 is greater than the holding force of the first connection in the exposed regions 502. The force with which the semiconductor chips 100 are sucked to the plate 200 is less than the holding force of the first connection, in regions where it was not weakened. Thus, semiconductor chips 100 arranged in exposed regions 502 remain on the plate 200. Semiconductor chips 100 arranged in unexposed regions of the connection means 501, remain on the carrier film 500. Thus, semiconductor chips 100 were selected in a targeted manner.

Figure 3A:
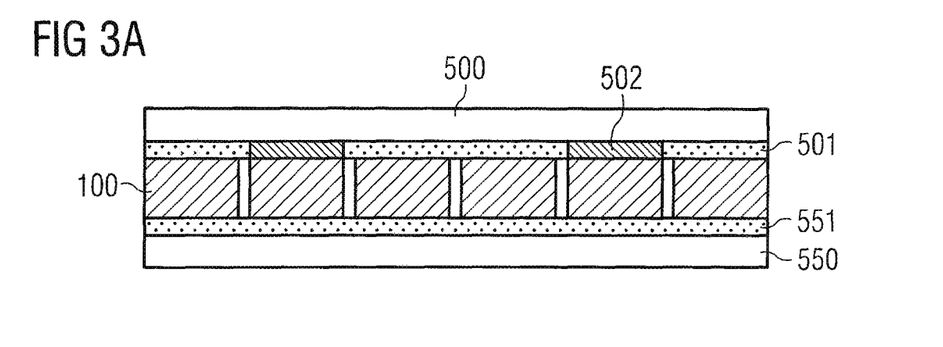
Figure 3B:
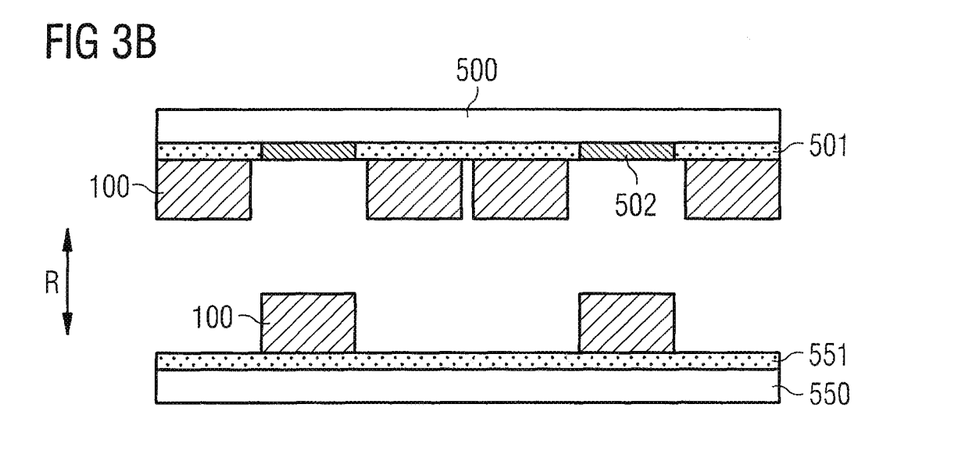

FIG. 3A shows, in a schematic sectional view, the semiconductor chips 100 from FIG. 1E when carrying out a method step E) of the method of selecting semiconductor chips 100 according to a second example. In particular, FIGS. 3A and 3B show alternative method steps to the method steps shown in FIGS. 2A and 2B. An adhesive film 550 is arranged on the side of the semiconductor chips 100 facing away from the carrier film 500. The adhesive film 550 comprises a further connection means 551 cohesively connected to the semiconductor chips 100 via a second connection. In particular, the adhesive film 550 cohesively connects to each semiconductor chip 100 via the second connection. For example, the adhesive film is a polymer film on which the further connection means 551 is arranged.

FIG. 3B shows in a schematic sectional representation, the semiconductor chips 100 from FIG. 3A when carrying out a method step E) of the method of selecting semiconductor chips 100 according to a second example. In this process step, the adhesive film 550 and the carrier film 500 are pulled apart along a direction R. The direction R runs, for example, perpendicular to the lateral plane. The holding force of the second connection, between the semiconductor chips 100 and the adhesive film 550, is greater than the holding force of the first connection in the exposed regions 502. The holding force of the second connection is less than the holding force of the first connection in regions where the connection means 501 was not exposed to electromagnetic radiation L. Semiconductor chips 100 arranged in exposed regions 502 remain on the adhesive film 550 after the carrier film 500 and the adhesive film 550 have been pulled apart. Semiconductor chips 100 arranged in unexposed regions of the connection means 501, remain on the carrier film 500 after the carrier film 500 and the adhesive film 550 have been pulled apart. Thus, semiconductor chips 100 were selectively selected.

Figure 4:
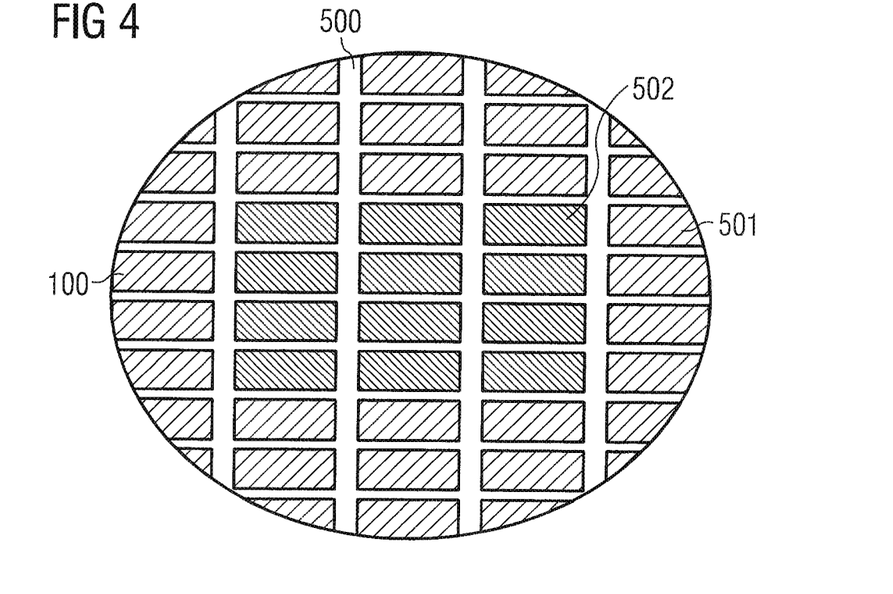
FIGS. 4, 5A and 5B show a schematic plan view of a multiplicity of semiconductor chips to which examples of a method of selecting semiconductor chips are applied.

FIG. 4 shows a schematic plan view of a multiplicity of semiconductor chips 100 after performing the method step D) of the method of selecting semiconductor chips 100 according to a third example. The semiconductor chips 100 are arranged on a carrier film 500. The carrier film 500 was selectively exposed to electromagnetic radiation L in predetermined regions 502 so that the first connection between the carrier film 500 and the semiconductor chips 100 is weakened. In this example, the first connection between the carrier film 500 and in the region 502 of the twelve centrally arranged semiconductor chips 100 is selectively weakened. Some semiconductor chips 100 are arranged in regions where the connection means layer 501 has not been exposed to electromagnetic radiation L and thus the first connection has not been weakened. For example, in a previous method step, a map may have been created, wherein the map comprises the electro-optical and/or electrical properties of the semiconductor chips and their position in the composite as data. Thus, depending on the data of the map, the connection between the semiconductor chips 100 and the carrier film 500 may be selectively weakened. In particular, the selection criterion, due to which the first connection between semiconductor chips 100 and carrier film 500 is weakened, may be the position of the semiconductor chips 100 within the composite 10.

Figure 5A:
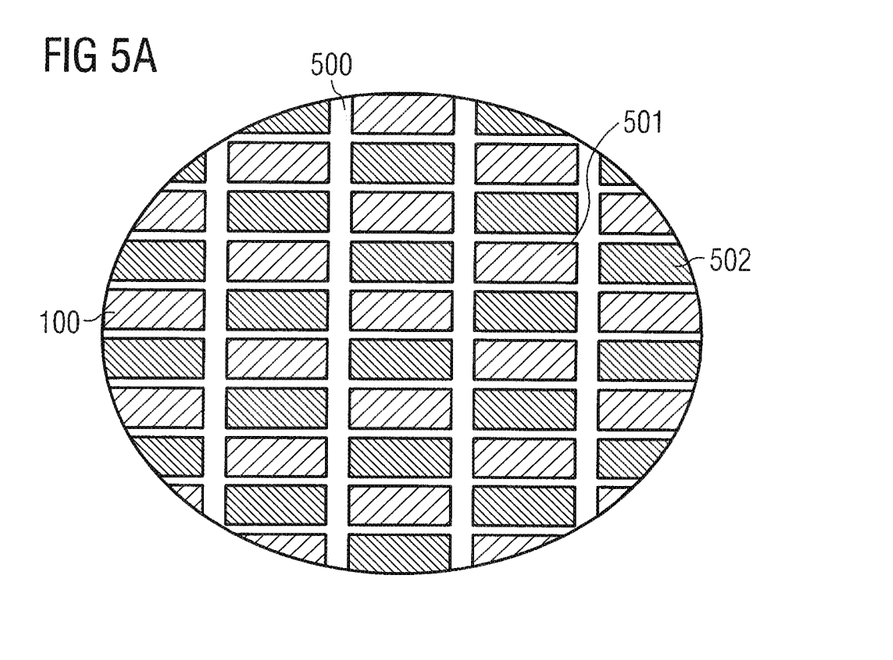

FIG. 5A shows a schematic plan view of a multiplicity of semiconductor chips 100 after performing the method step D) of the method of selecting semiconductor chips 100 according to a fourth example. FIG. 5A shows a schematic plan view of a carrier film 500 on which a multiplicity of semiconductor chips 100 is arranged. In this, the first connection between the semiconductor chips 100 and the carrier film 500 is weakened in the form of a checkerboard pattern. In other words, along the grid lines of a rectangular lattice, along the lateral plane, the mechanical connection between the semiconductor chips 100 and the carrier film 500 is alternately weakened in two mutually perpendicular directions. For example, the first connection is weakened by exposure of the connection means 501. Each semiconductor chip 100 arranged in an exposed region 502 in which the first connection to the carrier film 500 has been weakened, is arranged laterally adjacent to semiconductor chips 100 whose first connection to the carrier film 500 has not been weakened.

Figure 5B:
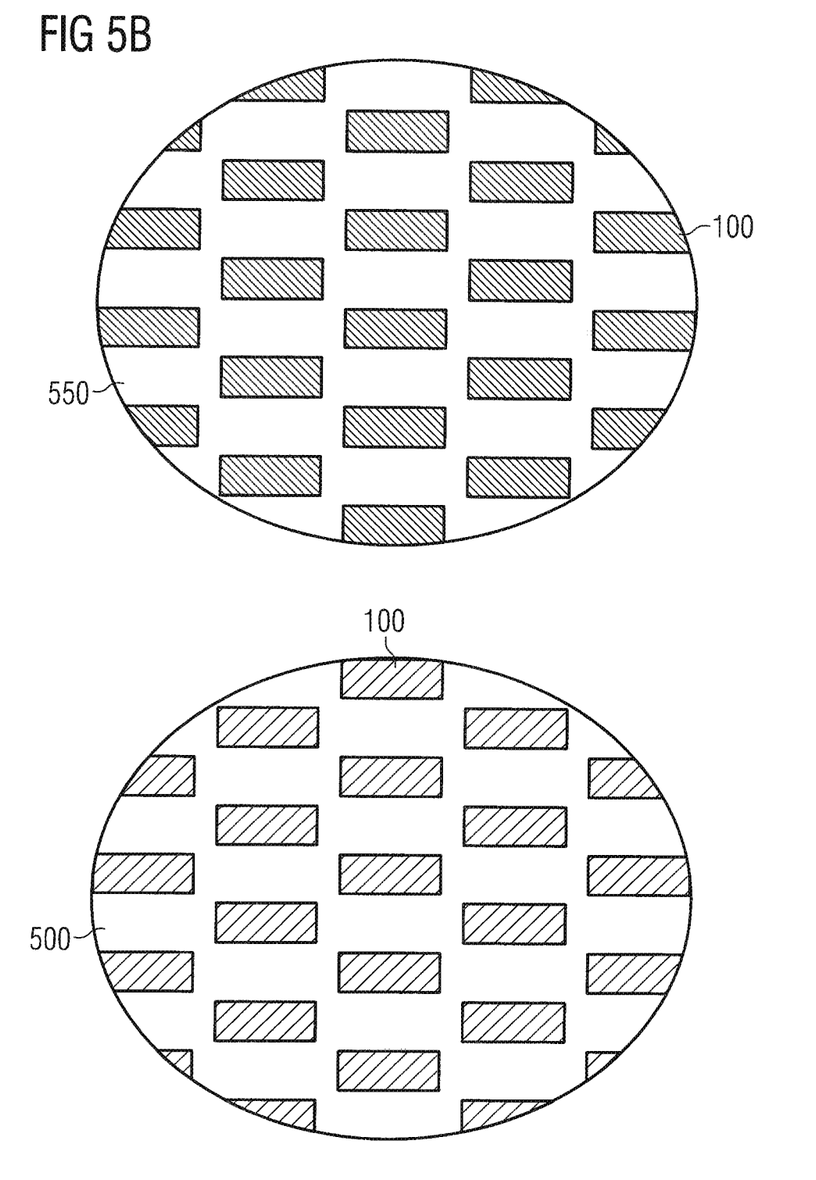

FIG. 5B shows a schematic plan view of a multiplicity of semiconductor chips 100 after performing the method step E) of the method of selecting semiconductor chips 100 according to a fourth example. In particular, FIG. 5B shows the plan view of the semiconductor chips from FIG. 5A, wherein some of the semiconductor chips 100 have been removed from the carrier film 500 by the adhesive film 550. In particular, the some semiconductor chips 100 have been transferred from the carrier film 500 to the adhesive film 550 by the method illustrated in FIGS. 3A and 3B.

For example, the semiconductor chips 100 on the carrier film 500 and on the adhesive film 550 have been selected depending on their spatial arrangement. In particular, the semiconductor chips 100 have been selected such that the distance between adjacent semiconductor chips 100 that remain on the carrier film 500 and/or adjacent semiconductor chips 100 arranged on the adhesive film 550 after the method step E) is at least 200 µm. In particular, the adhesive film 550 and/or the carrier film 500 can be stretched along their main extension direction so that the distance between the semiconductor chips 100 arranged on the respective film is increased in the lateral direction. Advantageously, individual semiconductor chips 100 can thus be further processed in a simplified manner.

In particular, the method steps D) and E) can be carried out several times in succession. For example, the semiconductor chips 100 mechanically firmly connect to the carrier film 500 or the adhesive film 550 after performing the process step E) according to the second example, and are selectively detached again from the carrier film 550 or the adhesive film in a process step D). In particular, the semiconductor chips 100 are selected in a second selection on the basis of a selection criterion, which is different from the selection criterion in the first execution of the method steps D) and E).

These selection criteria may be, for example, electrical and/or electro-optical properties of the semiconductor chip 100. For example, the semiconductor chips 100 configured to emit electromagnetic radiation can be selected depending on the color location of the emitted light. Alternatively, the semiconductor chips 100 may be selected depending on their current-voltage characteristic. In particular, semiconductor chips 100 configured to detect electromagnetic radiation can be selected depending on their sensitivity to electromagnetic radiation of specific wavelength ranges.

Our methods are not restricted to the examples by the description on the basis of the examples. Rather, this disclosure encompasses any new feature and also any combination of features which in particular comprises any combination of features in the appended claims and any combination of features in the examples, even if the feature or combination itself is not explicitly specified in the claims or examples.

This application claims priority of DE 102017101536.1, the subject matter of which is incorporated herein by reference.

The invention claimed is:

1. A method of selecting semiconductor chips comprising steps A)-E) in that order:
    A) providing the semiconductor chips in a composite so that the semiconductor chips comprise a common semiconductor layer stack via which the semiconductor chips are mechanically connected to one another,
    B) producing a cohesive, mechanical first connection between the semiconductor chips and a carrier film by a connection means between the composite and the carrier film, wherein the connection means is an adhesive and in direct contact with the composite and the carrier film, C) singulating the semiconductor chips, wherein the carrier film mechanically connects the semiconductor chips to one another after singulation, D) selectively weakening the first connection between some singulated semiconductor chips and the carrier film, depending on electro-optical and/or electrical properties of the semiconductor chips, and E) removing the semiconductor chips whose first connection is selectively weakened from the carrier film, wherein the semiconductor chips whose first connection are weakened in step D) comprise a common color location and/or a common current-voltage characteristic.

2. The method according to the claim 1, wherein, in method step D), the first connection between the carrier film and the semiconductor chips is selectively weakened by UV radiation.

3. The method according to claim 1, wherein, in method step D), the first connection between the carrier film and a plurality of semiconductor chips is selectively weakened in a single method step.

4. The method according to claim 1, wherein, in method step D), the first connection between the carrier film and the semiconductor chips is weakened, depending on the spatial arrangement of the semiconductor chips in the composite.

5. The method according to claim 4, wherein, in method step E), the semiconductor chips are removed depending on their spatial arrangement so that the distance between adjacent semiconductor chips that remain on the carrier film and/or adjacent semiconductor chips removed from the carrier film is at least 200 µm.

6. The method according to claim 1, wherein, prior to method step D), to selectively weakening the first connections between the semiconductor chips and the carrier film, a map is created, wherein the map comprises the electro-optical and/or electrical properties of the semiconductor chips and their position in the composite as data, and the first connections between the semiconductor chips and the carrier film are weakened depending on the data of the map.

7. The method according to claim 1, wherein the method steps D) and E) are performed alternately several times in succession.

8. The method according to claim 1, wherein, in method step E) the semiconductor chips are removed from the carrier film by suction.

9. The method according to claim 1, wherein the following method steps are carried out within method step E) to remove the semiconductor chips from the carrier film:

arranging an adhesive film on the side of the semiconductor chips facing away from the carrier film such that the adhesive film produces a cohesive, mechanical second connection with the semiconductor chips, wherein the first connection between the semiconductor chips and the carrier film is stronger than the second connection between the semiconductor chips and the adhesive film when the first connection has not been weakened, and the first connection between the semiconductor chip and the carrier film is weaker than the second cohesive connection between the semiconductor chip and the adhesive film when the first connection has been weakened, and removing the adhesive film, wherein semiconductor chips whose first connection to the carrier film has been weakened are removed from the carrier film.

10. The method according to claim 1, wherein a distance between adjacent semiconductor chips is increased by stretching the carrier film and/or the adhesive film.

11. The method according to claim 1, wherein the method steps D) and E) are performed alternately several times in succession, in a first execution of the method steps D) and E) semiconductor chips are selected depending on their spatial arrangement on the carrier film, and in a subsequent, second execution of the method steps D) and E) the semiconductor chips remaining on the carrier film are selected according to their electro-optical and/or electrical properties, or vice versa.

12. A method of selecting semiconductor chips comprising steps A)-E) in that order:

A) providing the semiconductor chips in a composite so that the semiconductor chips comprise a common semiconductor layer stack via which the semiconductor chips are mechanically connected to one another, B) producing a cohesive, mechanical first connection between the semiconductor chips and a carrier film by a connection means between the composite and the carrier film, wherein the connection means is an adhesive and in direct contact with the composite and the carrier film, C) singulating the semiconductor chips, wherein the carrier film mechanically connects the semiconductor chips to one another after singulation, D) selectively weakening the first connection between some singulated semiconductor chips and the carrier film, depending on a spatial arrangement of the semiconductor chips in the composite such that each semiconductor chip whose first connection is weakened is directly adjacent to semiconductor chips whose first connection is not weakened and each semiconductor chip whose first connection is not weakened is directly adjacent to semiconductor chips whose first connection is weakened, and E) removing the semiconductor chips whose first connection is selectively weakened from the carrier film.

13. The method according to claim 12 wherein, in D) the first mechanical connection between the semiconductor chips and the carrier film is weakened in the form of a checkerboard pattern.

14. A method for selecting semiconductor chips comprising steps A)-E) in that order: A) providing the semiconductor chips in a composite so that the semiconductor chips comprise a common semiconductor layer stack via which the semiconductor chips are mechanically connected to one another, B) producing a cohesive, mechanical first connection between the semiconductor chips and a carrier film by a connection means between the composite and the carrier film, wherein the connection means is an adhesive and in direct contact with the composite and the carrier film, C) singulating the semiconductor chips, wherein the carrier film mechanically connects the semiconductor chips to one another after singulation, D) selectively weakening the first connection between some singulated semiconductor chips and the carrier film, depending on electro-optical and/or electrical properties of the semiconductor chips and on the spatial arrangement of the semiconductor chips in the composite, and E) removing the semiconductor chips whose first connection is selectively weakened from the carrier film.

* * * * *